(12) United States Patent
Lau et al.

(10) Patent No.: US 8,291,396 B1
(45) Date of Patent: Oct. 16, 2012

(54) SCHEDULING OPTIMIZATION OF ALIASED POINTERS FOR IMPLEMENTATION ON PROGRAMMABLE CHIPS

(75) Inventors: David James Lau, Scotts Valley, CA (US); Jeffrey Orion Pritchard, Santa Cruz, CA (US); Philippe Molson, San Jose, CA (US)

(73) Assignee: Altera Corporation, San Jose, CA (US)

( * ) Notice: Subject to any disclaimer, the term of this patent is extended or adjusted under 35 U.S.C. 154(b) by 1794 days.

(21) Appl. No.: 11/523,261

(22) Filed: Sep. 18, 2006

Related U.S. Application Data

(60) Provisional application No. 60/759,686, filed on Jan. 17, 2006.

(51) Int. Cl.
*G06F 9/45* (2006.01)
*G06F 17/50* (2006.01)

(52) U.S. Cl. .................... 717/151; 717/160; 716/104

(58) Field of Classification Search ............... 717/151
See application file for complete search history.

(56) References Cited

U.S. PATENT DOCUMENTS

| 5,481,723 | A  | * | 1/1996  | Harris et al.     | 717/160 |
|-----------|----|---|---------|-------------------|---------|
| 5,537,620 | A  | * | 7/1996  | Breternitz, Jr.   | 717/160 |
| 5,809,308 | A  | * | 9/1998  | Tirumalai         | 717/161 |
| 6,247,173 | B1 | * | 6/2001  | Subrahmanyam      | 717/160 |
| 6,272,676 | B1 | * | 8/2001  | Haghighat et al.  | 717/150 |
| 6,634,024 | B2 | * | 10/2003 | Tirumalai et al.  | 717/161 |
| 6,952,816 | B2 | * | 10/2005 | Gupta et al.      | 716/103 |
| 7,263,692 | B2 | * | 8/2007  | Muthukumar et al. | 717/150 |
| 7,873,953 | B1 | * | 1/2011  | Pritchard et al.  | 717/154 |
| 2004/0068708 | A1 | * | 4/2004 | Sivaraman et al. | 716/10  |
| 2004/0068718 | A1 | * | 4/2004 | Cronquist et al. | 717/151 |
| 2004/0199907 | A1 | * | 10/2004 | Motokawa et al. | 717/140 |
| 2004/0268334 | A1 | * | 12/2004 | Muthukumar et al. | 717/160 |
| 2006/0090063 | A1 | * | 4/2006 | Theis            | 712/239 |
| 2007/0169059 | A1 | * | 7/2007 | Halambi et al.   | 717/160 |

OTHER PUBLICATIONS

B. Ramakrishna Rau, "Iterative Modulo Scheduling: An Algorithm for Software Pipelining Loops", MICRO 27 Proceedings ofthe 27th annual international symposium on Microarchitecture pp. 63-74 , ACM New York, NY, USA © 1994, total pp. 13.*
van Engelen et al. "An Efficient Algorithm for Pointer-to-Array Access Conversion for Compiling and Optimizing DSP Applications" © 2001 IEEE,retrived from <http://ieeexplore.ieee.org/stamp/stamp.jsp?tp=&arnumber=955200>, total pp. 10.*
Lau et al, "Automated Generation of Hardware Accelerators with Direct Memory Access from ANSI/ISO Standard C Functions", May 2006.

\* cited by examiner

*Primary Examiner* — Don Wong
*Assistant Examiner* — Marina Lee
(74) *Attorney, Agent, or Firm* — Kwan & Olynick LLP

(57) ABSTRACT

Various high-level languages are used to specify hardware designs on programmable chips. The high-level language programs include pointer operations that may have same iteration and future iteration dependencies. Single loop iteration pointer dependencies are considered when memory accesses are assigned to clock cycles. Multiple loop iteration pointer dependencies are considered when determining how often new data can be entered into the generated hardware pipeline without causing memory corruption. A buffer can be used to forward data from a memory write to a future read.

30 Claims, 10 Drawing Sheets

| State 201 | Operations 203 |
|---|---|
| 0 | my_array[i] = foo; |
| 1 | (read latency) |
| 2 | (read latency) |
| 3 | (read latency) |
| 4 | (read latency) |
| 5 | (read latency) |
| 6 | (read latency) |
| 7 | (ready latency) |
| 8 | bar = my_array[i+1]; |

*Figure 2a*

| Time 211 | i = io 213 | i = io + 1 215 |
|---|---|---|
| 0 | my_array[io] = foo; | |
| 1 | (read latency) | |
| 2 | (read latency) | |
| 3 | (read latency) | |
| 4 | (read latency) | |
| 5 | (read latency) | |
| 6 | (read latency) | |
| 7 | (ready latency) | |
| 8 | bar = my_array[io+1]; | |
| 9 | | my_array[io+1] = foo; |
| 10 | | (read latency) |
| 11 | | (read latency) |
| 12 | | (read latency) |
| 13 | | (read latency) |
| 14 | | (read latency) |
| 15 | | (read latency) |
| 16 | | (ready latency) |
| 17 | | bar = my_array[i+2]; |

*Figure 2b*

| Time 221 | i = io 223 | i = io + 1 225 | i = io + 2 227 |
|---|---|---|---|
| 0 | my_array[io] = foo; bar = my_array[io+1]; | | |
| 1 | (read latency) | my_array[io+1] = foo; bar = my_array[io+2]; | |
| 2 | (read latency) | (read latency) | my_array[io+2] = foo; bar = my_array[io+3]; |
| 3 | (read latency) | (read latency) | (read latency) |
| 4 | (read latency) | (read latency) | (read latency) |
| 5 | (read latency) | (read latency) | (read latency) |
| 6 | (read latency) | (ready latency) | (ready latency) |
| 7 | (ready latency) | (ready latency) | (ready latency) |
| 8 | | (ready latency) | (ready latency) |
| 9 | | | (ready latency) |

*Figure 2c*

| Time 350 | Iteration 0 300 p=po | Iteration 1 310 p=po+1 | Iteration 2 320 p=po+2 | |
|---|---|---|---|---|
| 0 | rd(po) | | | |
| 1 | | | | |
| 2 | | | | |
| 3 | | rd(po+1) | | ← CPLI = ceil((Sb-Sa)/ic) = ceil ((5-0+1)/2) = 3 |
| 4 | | | | |
| 5 | wr(po+2) | | | ← write issued to address po+2 |
| 6 | | | | ← read issued from address po+2 |
| 7 | | | rd(po+2) | |
| 8 | | wr(po+3) | | |
| 9 | | | | |
| 10 | | | | |
| 11 | | | wr(po+4) | |

*Figure 3*

SCHEDULING OPTIMIZATION OF ALIASED POINTERS FOR IMPLEMENTATION ON PROGRAMMABLE CHIPS

CROSS REFERENCE TO RELATED APPLICATIONS

This application claims priority to provisional U.S. Provisional Patent Application Ser. No. 60/759,686 filed Jan. 17, 2006, titled "Automated Generation of Hardware Accelerators with Direct Memory Access from ANSI/ISO Standard C Functions" which is incorporated herein by reference in its entirety.

BACKGROUND OF THE INVENTION

1. Field of the Invention

The present invention relates to implementing high-level language code on programmable chips. In one example, the present invention relates to methods and apparatus for providing scheduling optimization for high-level language code.

2. Description of Related Art

Mechanisms for implementing designs of hardware modules from high-level languages such as C or C++ allow designers to work at a relatively high level of abstraction. Designers no longer need to concern themselves as much with low-level circuit implementation details. A variety of tools have been developed to allow implementation of designs such as programmable chip designs from a high-level language such as C or C++.

In one example, code written in a general purpose programming language such as C or C++ is converted into a hardware descriptor language (HDL) file using a tool such as the DK1 Design Suite available from Celoxica Corporation of Abingdon, England. The HDL file can then be synthesized and implemented on a programmable chip such as a programmable logic device (PLD) or a field programmable gate array (FPGA). Some available synthesis tools are Leonardo Spectrum, available from Mentor Graphics Corporation of Wilsonville, Oreg. and Synplify available from Synplicity Corporation of Sunnyvale, Calif.

However, mechanisms for efficiently optimizing code from a high-level language on programmable devices are limited. It is therefore desirable to provide improved methods and apparatus for optimizing implementation of programmable chips.

SUMMARY OF THE INVENTION

Various high-level languages are used to specify hardware designs on programmable chips. The high-level language programs include pointer operations that may have same iteration and future iteration dependencies. Single loop iteration pointer dependencies are considered when memory accesses are assigned to clock cycles. Multiple loop iteration pointer dependencies are considered when determining how often new data can be entered into the generated hardware pipeline without causing memory corruption. A buffer can be used to forward data from a memory write to a future read.

In one embodiment, a technique for scheduling pointer operations for implementation on a programmable chip is provided. A pointer A and a pointer B included in a high level program language loop are identified. An iteration count IC is determined. The iteration count IC is a number of loop iterations after which a collision occurs between pointer A and pointer B. A memory latency L for accessing a memory associated with the programmable chip is determined. The memory latency L and the iteration count IC are used to determine a number of clock cycles required to perform the high-level language program loop. A hardware accelerator for implementation on the programmable chip is generated. The hardware accelerator is operable to perform the high-level language program loop.

In another embodiment, a computer system for implementing a programmable chip is provided. The computer system include an interface and a processor. The interface is operable to receive high-level language code. The processor is operable to identify a pointer A and a pointer B included in a high level program language loop. The processor also determines an iteration count IC. The iteration count IC is a number of loop iterations after which a collision occurs between pointer A and pointer B. Also determined is a memory latency L for accessing a memory associated with the programmable chip. The memory latency L and the iteration count IC are used to determine a number of clock cycles required to perform the high-level language program loop. A hardware accelerator is generated for implementation on the programmable chip. The hardware accelerator is operable to perform the high-level language program loop.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

FIGS. 2a-2c are diagrammatic representations showing pointer scheduling.

FIG. 3 is a diagrammatic representation showing efficient scheduling for known future iteration aliasing.

DETAILED DESCRIPTION OF SPECIFIC EMBODIMENTS

Figure 1:
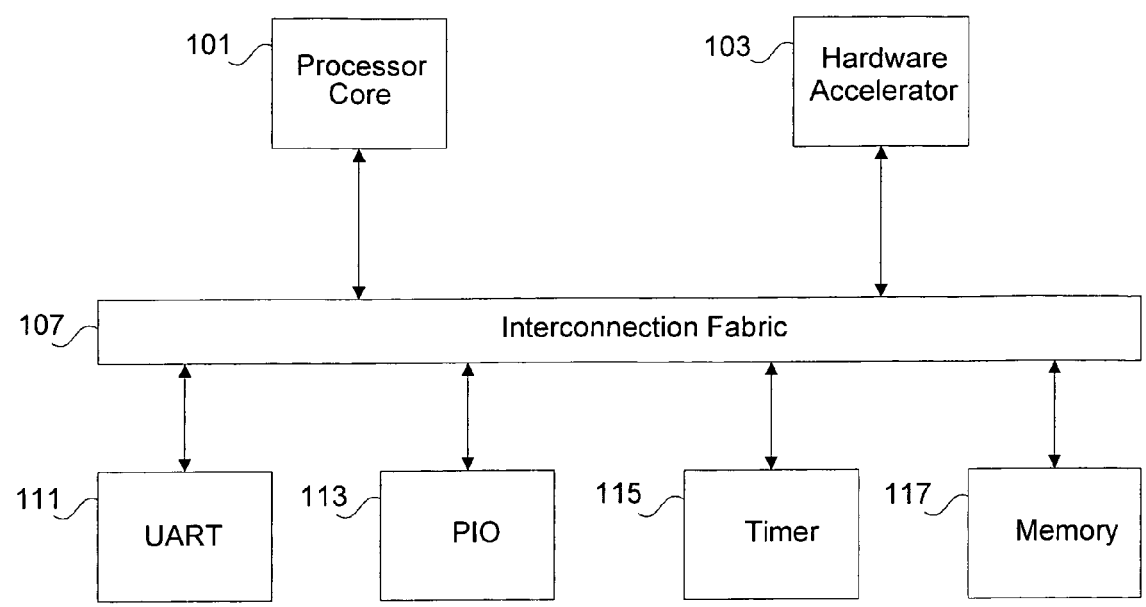
FIG. 1 is a diagrammatic representation showing a programmable device.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of programmable devices, high-level programming languages, processors, and hardware accelerators. However, it should be noted that the techniques of the present invention can be applied to a variety of partially programmable devices, languages, and components. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Furthermore, techniques and mechanisms of the present invention will sometimes be described in singular form for clarity. However, it should be noted that some embodiments include multiple iterations of a technique or multiple instantiations of a mechanism unless noted otherwise. For example, a processor is used in a variety of contexts. However, it will be appreciated that multiple processors can also be used while remaining within the scope of the present invention unless otherwise noted.

A variety of systems can be implemented on programmable devices. In one example, a computer system with a processor core, memory, local area network (LAN) interface, and a universal asynchronous receiver transmitter (UART) can be implemented on a single programmable device such as a Field Programmable Gate Array (FPGA). The programmable device can also include customized logic for performing specialized functions for optimizing a particular application. In one example, logic elements are allocated for implementing a digital signal processing (DSP) core for performing Fast Fourier Transform (FFT) operations. In another example, logic elements are allocated for optimizing video rendering functions.

Designers have a variety of options available for implementing a system on a programmable device. In typical instances, the designer provides both a hardware and a software design. A hardware design can be used to implement a particular hardware accelerator on the programmable device. Software can run on a general-purpose processor included on the device. Any logic or mechanisms supporting a general-purpose instruction set such as a reduced instruction set computing (RISC) instruction set, a complex instruction set computing (CISC), or a very long instruction word (VLIW), instruction set is referred to herein as a general-purpose processor or a central processing unit. Conventional processors include the Xeon line of processors available from Intel Corporation of Santa Clara, Calif. and the Opteron line of processors available from AMD of Sunnyvale, Calif. Conventional processing cores available for implementation on a system on a chip (SOC) or a system on a programmable chip (SOPC) include the ARM line of processor cores available from ARM Ltd. of Cambridge, England.

A system on a programmable chip typically includes logic implemented using a Hardware Description Language (HDL). However, using HDL may not be a very efficient or effective way of optimizing an application optimized programmable chip. HDL often requires knowledge about the underlying hardware, and relatively few people have familiarity with HDL.

Other languages for implementing logic on a device have been developed based on high-level programming languages. Any language that can be used to describe software functions and/or objects without extensive knowledge of the underlying hardware used to implement the software is referred to herein as a high-level language. Examples of high-level languages include C, C++, Java, and Pascal conventionally used by software engineers. Other variations include Matlab and VisualBasic. High-level languages are typically general purpose and interact with hardware using operating system associated application program interfaces (APIs).

The high-level language includes mechanisms for implementing function calls. The high-level language description is compiled into a generic sequential flow by parsing, building a symbol table, and generating a generic sequential flow using typical compiler techniques. Some tools including HDL Designer available from Mentor Graphics Corporation of Wilsonville, Oreg. and the DK1 Design Suite available from Celoxica of Abingdon, England provide high-level language like syntax, typically C-like syntax, for implementing a portion of a program in hardware while leaving the rest as a software implementation. However, tools that provide high-level language like syntax for implementing hardware on a programmable device have significant drawbacks.

Many tools allow implementation of a hardware design from a high-level language, but the tools lack full support of pointers and arrays. Furthermore, scheduling pointer memory access is typically inefficient, particularly access to memory that is external to a hardware accelerator or offchip. Consequently, the techniques of the present invention allow synthesis of hardware designs from high-level languages in a manner that provides full pointer and array support. Pointer memory access is efficiently scheduled to account for memory access latency. In some examples, memory transactions are pipelined efficiently by accounting for address offsets as well as memory access latency.

Both same loop iteration operations as well as successive loop iterations operations can be pipelined. In one example, read latency of connected slave ports is determined when scheduling pointer operations that require memory transactions in same loop operations. Based on the memory latency, the compiler is able to increase the computation time for the pointer operation, allowing other non-dependent operations to be evaluated while the accelerator waits for read data to return. Operations in successive loop iterations can also be pipelined. Pipeline execution of successive loop iterations is allowed by providing that multiple states in the loop's state machine be active simultaneously.

The frequency at which new iterations can enter the pipeline is determined by analysis of loop-carried dependencies. For example, if operation A, which occurs in the first state of the loop, is dependent on the result of operation B from the previous iteration, then new iterations cannot enter the pipeline until the state in which B is valid. This analysis is performed after the operations in a loop have been scheduled (assigned state numbers). It is possible to separate these two processes because state number assignment is concerned with dependency between two operations in the same iteration, whereas the loop iteration frequency calculation is concerned with dependency between two operations of different iterations. Loop iteration pipelining allows the accelerator to issue multiple outstanding read operations to latent slaves, effectively hiding the memory latency in many cases.

FIG. 1 is a diagrammatic representation showing one example of a system on a programmable chip that can be implemented using high-level language programs. The system includes a processor core, a hardware accelerator, peripheral devices, and peripheral interfaces. Peripheral devices and peripheral interfaces are herein referred to as components. The system on a programmable chip includes processor core 101 and a hardware accelerator 103 as well as peripheral components UART 111, PIO 113, timer 115, and data memory 117. In some examples, the hardware accelerator 103 is a Digital Signal Processing (DSP) core, a cryptography accelerator, or a video processor. It should be noted that the system can include both on-chip memory 117 and off-chip memory. In one example, the data memory 117 can support variable latency or fixed latency access. The components are interconnected using an interconnection fabric 107. Any mechanism or logic for connecting components in a system is referred to herein as an interconnection fabric. In one example, the interconnection fabric is a bus. In another example, the interconnection fabric is a slave side arbitration fabric.

The programmable chip uses different types of resources that can be interchangeably used in different allocations to implement the system on a programmable chip. In one example, the programmable chip uses logic elements for implementing each of the various components on the programmable chip.

Logic elements typically can be implemented using components such as antifuses, static RAM, and EPROMS. Any mechanism on a programmable chip that performs an operation on a given number of input lines to provide one or more outputs based on information programmed is herein referred to as a logic element.

Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

The techniques and mechanisms of the present invention allow the implementation of a system on a programmable chip from a high-level language program. According to various embodiments of the present invention, it is recognized that a bus is no longer required in certain applications such as system on a chip, system on a programmable chip, and other computer system implementations. A device such as a programmable logic device (PLD) or a field programmable gate array (FPGA) using a hardware descriptor language (HDL) is herein referred to as a programmable chip or a programmable device. Instead of implementing complicated bus sharing schemes using mechanisms such as splitting, the bus itself can be eliminated to improve system performance.

According to specific embodiments, it is recognized that master components and slave components need not be routed through a construct such as a bus. By not routing signals through a bus, a streaming output device can be implemented in a much more efficient manner. The conventional data and address lines that make up the bus are no longer the resource in contention. Instead, slave components are resources in contention, as the number of physical lines connected to each slave component in a system can be fixed. Furthermore, by not using a bus, interconnection flexibility is enhanced. For example, a hardware accelerator can be allocated a variety of ports for directly accessing a memory and the only resource in contention would be the memory.

Consequently, a system bus arbitrator associated with all the slave components in a computer system is no longer needed. Instead, slave components themselves that may be accessed by more than one master component are assigned individual slave side arbitrators. An arbitrator that corresponds to a specific slave component accessible by more than one master component is referred to herein as a slave side arbitrator. In one embodiment, there is a slave side arbitrator for each slave component in a computer system. In other embodiments, there is a slave side arbitrator for selected slave components in a system. The techniques of the present invention recognize that hardware accelerator support for high-level language programs can be more efficiently and effectively provided in a system by using slave side arbitration.

In many conventional systems, a high-level language program could not easily be hardware accelerated because of problems with pointer referencing and dereferencing. For example, if a write to the address 0xFF0D is to be performed by a hardware accelerator, the hardware accelerator should have direct access to the address 0xFF0D. However, in many instances the hardware accelerator does not have access to addresses associated with pointers. Consequently, conventional mechanisms for implementing a programmable device with hardware acceleration from a high-level programming language could either not handle pointers or had to handle pointers in a very obtuse fashion. In one example, pointers simply could not be included as a target of hardware acceleration. Pointers would be handled strictly in software by a processor core.

In another example, complex logic would be wrapped around the pointer access. A hardware accelerator would first forward the request to a processor to obtain access to a pointer associated line in memory. The pointer associated with the line in memory would then be copied into the address space accessible by the hardware accelerator. All of this memory copying is highly inefficient, and typically removes any added efficiency advantages obtained by using hardware acceleration. Similarly, off-chip memory lines would similarly have to be copied into the address accessible by the hardware accelerator. Typical hardware accelerators are only allocated a portion of the available memory space to prevent accelerators from interfering with system operation. In one example, a hardware accelerator and the rest of a computer system are built by separate designers. System code may be written in a portion of memory accessible only by a processor core to prevent stray writes by a hardware accelerator into system code. Stray writes or reads may corrupt system operation.

However, the techniques of the present invention allow a system and a hardware accelerator to be configured efficiently and effectively by the same designer. According to various embodiments, the hardware accelerator is generated as a system is generated, based on a description provided by a designer. Consequently, the mechanisms of the present invention can allow a hardware accelerator to access the same address space to which a processor has access. Concerns with either inadvertent or malicious system corruption are reduced. The techniques of the present invention can allow more robust pointer handling, as the techniques of the present invention provide hardware accelerator ports configured for handling pointer referencing and dereferencing. In typical instances, pointer referencing and dereferencing is not possible without providing a hardware accelerator with access to much of the address space.

Pointer scheduling is also improved. Both same iteration pointer dependencies as well as future iteration pointer dependencies are considered in order to increase pipeline efficiency. In many traditional implementations, no distinction is made between same iteration pointer dependencies and future iteration pointer dependencies, and if there are future iteration pointer dependencies, a cycle per loop iteration CPLI value is calculated based on a worst case scenario. That is, an assumption is made that operations collide on a next state. However, if future iteration dependencies are calculated with more specificity, a more optimized CPLI can be calculated and pointer loop operations can be implemented with greater efficiency.

FIGS. 2a-2c are diagrammatic representations showing pointer scheduling. Determining whether two pointer operations need to be scheduled sequentially should only be a function of same-iteration dependency. A parser can be used to identify pointer operations. If future-iteration dependencies are taken into account, then latency and throughput are compromised. For example, the following loop shows a read and a write operation that has a future-iteration dependency (read address will collide with write address used in the next iteration), but not a same-iteration dependency.

```
for (i=0; i<256; i++)
{
  // ...
  my_array[i]=foo;
  bar=my_array[i+1];
  // ...
}
```

FIG. 2a shows the two operations scheduled sequentially (assuming a read latency of 8). States 201 correspond to pointer operations 203. According to various embodiments, the various states correspond to time periods or clock cycles. At a state 0, my_array[i] gets assigned the value of foo, but because of read latency, a subsequent operation can not occur until the read operation has finished. Read latency may result from clock cycles required to access and obtain a particular physical memory address line. In typical implementations, any looping dependency would prevent issuing of the next iteration's write operation until the read operation bar=my_array[i+1] has finished. This would increase CPLI to 8, providing a safe but inefficient way of implementing the pointer loop operations. Any mechanism identifying a memory line is referred to herein as a pointer. Any mechanism accessing a particular memory line using a pointer is referred to herein as a pointer operation.

FIG. 2b shows read and write operations during successive iterations at various time 211 and iteration values 213 and 215. During a first iteration, when i=io, my_array[io] gets the value of foo at time 0. Due to read latency, bar does not get the value of my_array[io+1] until time 8. During a second iteration, when i=io+1, my_array[io+1] does not get the value of foo until time 9 due to perceive data dependencies. Even though there is no same iteration dependency between the two operations, the i=io+1 operations do not begin until time 9. The variable bar does not get the value of my_array[i+2] until time 17.

FIG. 2C shows read and write operations during successive iterations upon determining that no same iteration dependency exists. FIG. 2C shows time values 221 for successive iterations 223, 225, and 227. At time 0, my_array[io] gets the value of foo and bar gets the value of my_array[io+1]. At time 1, my_array[io+1] gets the value of foo and bar gets the value of my_array[io+2]. At time 2, my_array[io+2] gets the value of foo and bar gets the value of my_array[io+3].

According to various embodiments, to determine if two pointers have a same-iteration dependency, the address expression is collapsed by propagating upstream assignments up to the top of the loop. If they have a non-zero constant offset, they do not have a same-iteration dependency. Otherwise, they are assumed to have same-iteration dependency.

According to various embodiments, the future iteration dependency calculation ignores same-iteration dependency. Note that it is possible for two pointers to have both same-iteration and future-iteration dependencies, for example, if their addresses are the same and do not change between iterations, or if analysis is unable to determine if their addresses are different.

In one example, two operations (A & B) can be determined to have a later-iteration dependency by starting with expressions for A & B that are collapsed (via propagation of upstream assignments) up to the top of the loop. These collapsed expressions are A0 and B0. A0 can be looped back around to the bottom of the loop and collapsed again up to the top of the loop. This collapsed expression is A1. According to various embodiments, A1 is then compared to B0. If they cannot be determined to have a constant nonzero offset, it is assumed that there is a dependency between these two iterations. A0 can then continue to be looped back around N times, until it is determined that there is dependency. N is the different in the state numbers of A and B. It should be noted that A0 is not compared to B0, as this would be a same-iteration dependency calculation. Same-iteration dependencies have already been accounted for in the scheduling process. Instead, B0 is compared with A1, A2, A3, . . . AN.

The number of cycles of per loop iteration is referred to herein as the CPLI. The CPLI corresponds to the number of cycles needed before a subsequent loop iteration it started. If two operations have future-iteration dependencies at unknown or variable times, then CPLI is calculated as (state_of operation_b−state_of operation_a+1). However, this is a worst case scenario, as it assumes that operations collide on the next state.

The techniques of the present invention recognize that if the two operations have future-iteration dependencies at known times, the number of clock cycles needed to perform an iteration can be determined more efficiently. According to various embodiments, the CPLI can be determined more efficiently. For example, the following loop moves two pointers sequentially through an array, with the write pointer ahead of the read pointer. The address of the write operation collides with the address of the read operation N iterations in the future.

```
do
{
  //*(p+N)=*p; // N is a constant known at compile-time
  p++;
} while (some_condition);
```

According to various embodiments, the read operation is assigned a state of zero. Because of the data dependency, the write operation needs to be scheduled after the read latency of the memory has been overcome. Assuming a memory latency of L, the read and write operations are scheduled as follows:

| State | Op |
|---|---|
| 0 | rd(p) |
| . . . | |
| L | wr(p + N) |

Sa refers to the state number of the upstream child, which is dependent in successive iterations on the result of the downstream child in the current iteration. Sb refers to the state number of the downstream child, which produces a result that is used by the upstream child in a later iteration. In this example, Sa=0 (state number of the read operation) and Sb=L (state number of the write operation).

In typical implementations, CPLI is calculated as (Sb−Sa+1). However, it is recognized that this is the worse case scenario. It assumes that the two operations will collide immediately on the next iteration. Therefore, it is assumed that this many cycles of latency need to be inserted before the next iteration. However, in the case where it is known exactly how many iterations later the collision occurs, (Sb−Sa+1) cycles of latency do not need to be realized immediately. There are a known number of states in which to distribute it.

The number of iterations after which a collision occurs between two pointers is referred to herein as an iteration count (IC). In some examples, the iteration count is merely a constant offset between the pointers known at compile-time. For example, where one pointers has the value of *p and another has the value of *(p+N), the iteration count would be N. According to various embodiments, it is recognized that to distribute the latency across multiple iterations, the number of cycles of latency that need to occur is divided by the number of iterations or iteration count in the following manner CPLI=ceil((*Sb*−*Sa*+1)/IC)

The following example shows a loop having an iteration count of 2 and a read latency of 5. The iteration count is the number of iterations in the future in which a collision or memory aliasing will occur. In this example, the read operation will collide with the write operation in 2 iterations.

```
do
{
// . . .
*(p+2)=*p; II read latency=5
p++;
} while (some_condition);
```

Since read latency is 5, for example 5 clock cycles, the state of the read operation Sa is 5 cycles before the state of the write operation Sb. In this example, Sa=0 and Sb=5. The CPLI is calculated as CPLI=ceil((*Sb*−*Sa*+1)/ic)

CPLI=ceil((5−0+1)/2)

CPLI=3

FIG. 3 shows read and write operations having future iteration dependency. Read and write operations are shown at various time values 350 and during successive iterations 300, 310, and 320. During an iteration 0 300, p=po. During an iteration 1 310, p=po+1. During an iteration 2 320, p=po+2. During an iteration 1 310, a read of the po occurs at time 0. A write of po+2 during iteration 0 310 occurs at time 5, due to the 5 cycle read latency. However, because no collision will occur for an iteration count of 2, an iteration 1 310 read of po+1 can occur at time 3, since the CPLI=ceil((Sb−Sa+1)/ic) =ceil((5−0+1)/2=3. A write of po+3 during iteration 1 320 occurs at time 5, 5 cycles after the read of po+1 due to the read latency.

During iteration 2 330, a read of po+2 occurs at time 6. It should be noted that the read of po+2 in iteration 2 320 occurs immediately after the write of po+2 in iteration 0 300. By calculating CPLI intelligently, read and write operations can be more efficiently scheduled. The write of po+4 in iteration 2 320 occurs 5 cycles after the read of po+2 due to the read latency.

Forwarding of data from a write operation to a later colliding read operation can be handled by simple C code transformations. If a write is followed by a read and same-iteration addresses are equivalent, then a read pointer is turned into a simple intermediate assignment that takes the write data value from the write pointer. For example, the following loop can modified.

```
for (i=0; i<256; i++)
{
// . . .
my_array[i]=foo;
bar=my_array[i];
// . . .
}
```

Intermediate assignments are added to take a write data value from the write pointer as noted in the following code:

```
for (i=0; i<256; i++)
to {
// . . .
int my_array_i_writedata=foo;
my_array[i]=my_array_i_writedata;
my_array_i_readdata=my_array_i_writedata;
bar=my_array_i_readdata;
// . . .
}
```

If a read is followed by a write and it is known that the addresses will collide some constant number N iterations later, the first N items can be prefetched and the rest can be forwarded. A limit can be applied so that only a specified number of prefetches occur. For example, the following loop can be modified:

```
for (i=0; i<256; i++)
{
// . . .
bar=my_array[i];
my_array[i+2]=foo;
// . . .
}
```

The values for my_array[0] and my_array[1] are prefetched as noted in the following code:

```
int prefetch0=my_array[0];
int prefetch1=my_array[1];
for (i=0; i<256; i++)
{
// . . .
bar=prefetch0;
int my_array_i_plus_2_writedata=foo;
my_array[i+2]=my_array_i_plus_2_writedata;
prefetch0=prefetch1;
prefetch1=my_array_i_plus_2_writedata;
// . . .
}
```

A variety of programmable chip implementations can use the techniques of the present invention. In one example, the techniques and mechanisms of the present invention can be implemented using a processor core and a hardware accelerator included on a programmable chip.

Figure 4:
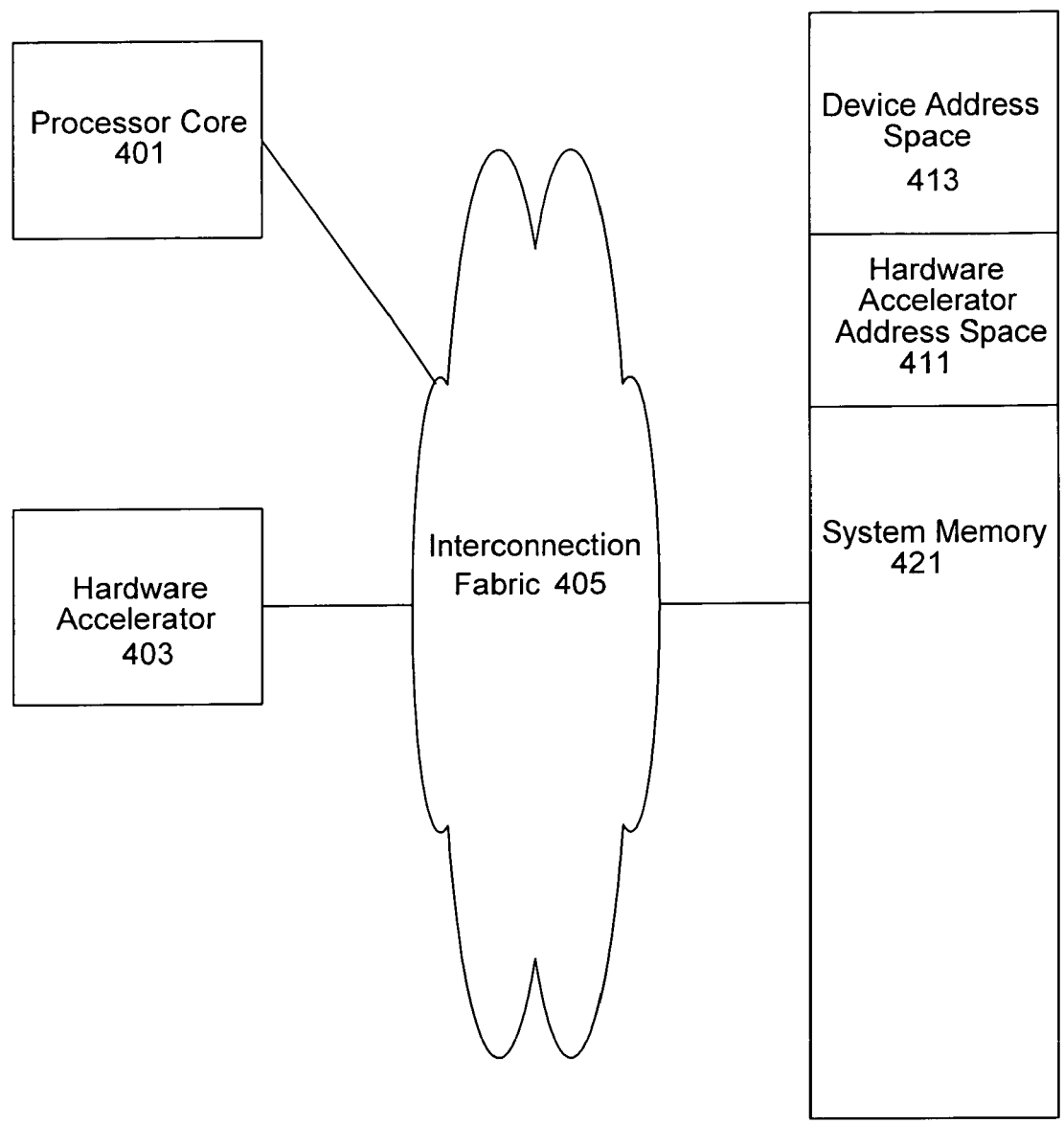
FIG. 4 is a diagrammatic representation depicting components and a system memory map.

FIG. 4 is a diagrammatic representation showing an example of an address map associated with a programmable device processor core. A processor core 401 and a hardware accelerator 403 are coupled to a system memory 421 through an interconnection fabric 405. In one example, the interconnection fabric 405 is a system bus. In another example the interconnection fabric 405 is a simultaneous multiple primary component fabric. A processor core 401 has access to the address space associated with system memory 421. A portion of system memory 421 is allocated for devices. In one example, a portion 411 is allocated to the hardware accelerator as a hardware accelerator address space and a portion 413 is allocated to other devices in the system.

When a hardware accelerator performs a read or write operation, the read or write operation can only occur for memory lines within the portion 413. In many conventional systems, a processor core 401 has access to the entire system memory address space. When pointers are used in the software program, read and write requests are often directed at specific memory addresses. For example, a pointer with an address 0xFF0D may be the target of a write operation. To perform the write, the processor core 401 accesses the address 0xFF0D in the system memory 421 address space.

However, other devices such as hardware accelerator 403 may only have access to a portion of system memory. In one example, a hardware accelerator 403 is a DSP core that is provided with access only to hardware accelerator address space 411. In many conventional systems, a high-level language program could not easily be hardware accelerated because of problems with pointer referencing and dereferencing. For example, if a write to the address 0xFF0D is to be performed by a hardware accelerator 403, the hardware accelerator 403 should have direct access to the address 0xFF0D. However, in many instances the hardware accelerator 403 does not have access to addresses associated with pointers. Consequently, conventional mechanisms for implementing a programmable device with hardware acceleration from a high-level programming language could either not handle pointers or had to handle pointers in a very obtuse fashion. In one example, pointers simply could not be included as a target of hardware acceleration. Pointers would be handled strictly in software by a processor core.

In another example, complex logic would be wrapped around the pointer access. A hardware accelerator would first forward the request to a processor to obtain access to a pointer associated line in memory. The pointer associated with the line in memory would then be copied into the address space accessible by the hardware accelerator. All of this memory copying is highly inefficient, and typically removes any added efficiency advantages obtained by using hardware acceleration. Similarly, off-chip memory lines would similarly have to be copied into the address accessible by the hardware accelerator. Typical hardware accelerators are only allocated a portion of the available memory space to prevent accelerators from interfering with system operation. In one example, a hardware accelerator and the rest of a computer system are built by separate designers. System code may be written in a portion of memory accessible only by a processor core to prevent stray writes by a hardware accelerator into system code. Stray writes or reads may corrupt system operation.

However, the techniques of the present invention allow a system and a hardware accelerator to be configured efficiently and effectively by the same designer. According to various embodiments, the hardware accelerator is generated as a system is generated, based on a description provided by a designer. Consequently, the mechanisms of the present invention can allow a hardware accelerator to access the same address space to which a processor has access. Concerns with either inadvertent or malicious system corruption are reduced. The techniques of the present invention can allow more robust pointer handling, as the techniques of the present invention provide hardware accelerator ports configured for handling pointer referencing and dereferencing. In typical instances, pointer referencing and dereferencing is not possible without providing a hardware accelerator with access to much of the address space.

Figure 5:
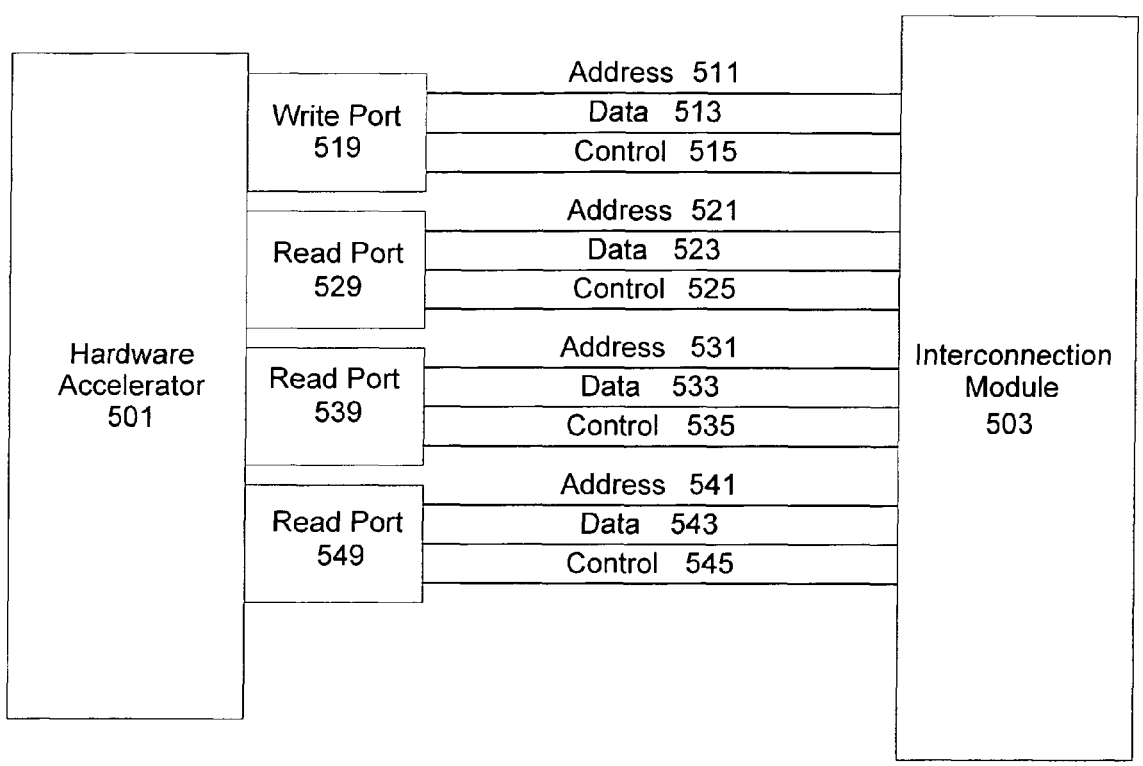
FIG. 5 is a diagrammatic representation depicting generated ports for handling pointer reads and writes.

FIG. 5 is a diagrammatic representation of one example of a hardware accelerator having associated read and write ports for handling pointer referencing and dereferencing. According to various embodiments, a number of read ports 529, 539, and 549 as well as a write port 519 are provided with the hardware accelerator 501. In one example, the write port 519 is provided for each pointer write identified in a hardware accelerated portion of a high-level language program. For example, if code to be implemented on a hardware accelerator includes a write to a pointer having an address 0x80D356, a write port configured to write data to this particular address is provided. In some examples, if writes to pointers having 10 different addresses are included in high-level language program code, 10 different write ports each configured with a corresponding address are configured for the hardware accelerator 501. To handle a pointer write to an address 0x80D356, the address line 511 is configured to maintain this particular address when the hardware accelerator 501 is supplemented. To implement the pointer write, the write port having an address 0x80D356 is selected. In one example, the address line is 511. Data to be written is provided on data line 513. One or more control lines may also be used.

The hardware accelerator 501 may also include other write ports associated with other pointer addresses or may include write ports not configured with any specific address. The techniques of the present invention provide an interconnection module 503 and allows a hardware accelerator 501 to have a large number of write ports without substantially affecting system performance. In conventional systems, a hardware accelerator 501 would have a limited number of write ports. In one example, a hardware accelerator having a large number of write ports in a system bus architecture would have a negative impact on system performance. According to various embodiments, the interconnection module 503 provides connections between a master component such as a hardware accelerator 501 and a slave component using a slave side arbitrator. Consequently, a large number of write ports can be arbitrator using slave side arbitration without having to go through a bus bottlenecks.

By using generated ports to handle pointer writes, techniques of the present invention can robustly handle pointer referencing and dereferencing in a manner that does not substantially affect system performance. According to various embodiments, the hardware accelerator 501 is no longer limited to a portion of the device address space allocated by a processing core. The hardware accelerator 501 can have access to the entire memory address space of a system CPU. That is, the hardware accelerator 501 has access to be same addresses to which the system processor core has access. In order to perform a write to address 0x446D88, the data value does not first have to be copied into the address space allocated to the hardware accelerator 501. Instead, a write port having address 0x446D88 can be provided to handle this pointer write. If the hardware accelerated portion of the high-level language program also includes a write to address 0xFF56DA, a write port having 0xFF56DA as the address can also be provided. Read ports can similarly be used to handle pointer reads. For example, pointer read addresses can be configured for address lines 521, 531, and 541 to allow data to be read on data lines 523, 533, and 543 using control lines 525, 535, and 545.

Figure 6:
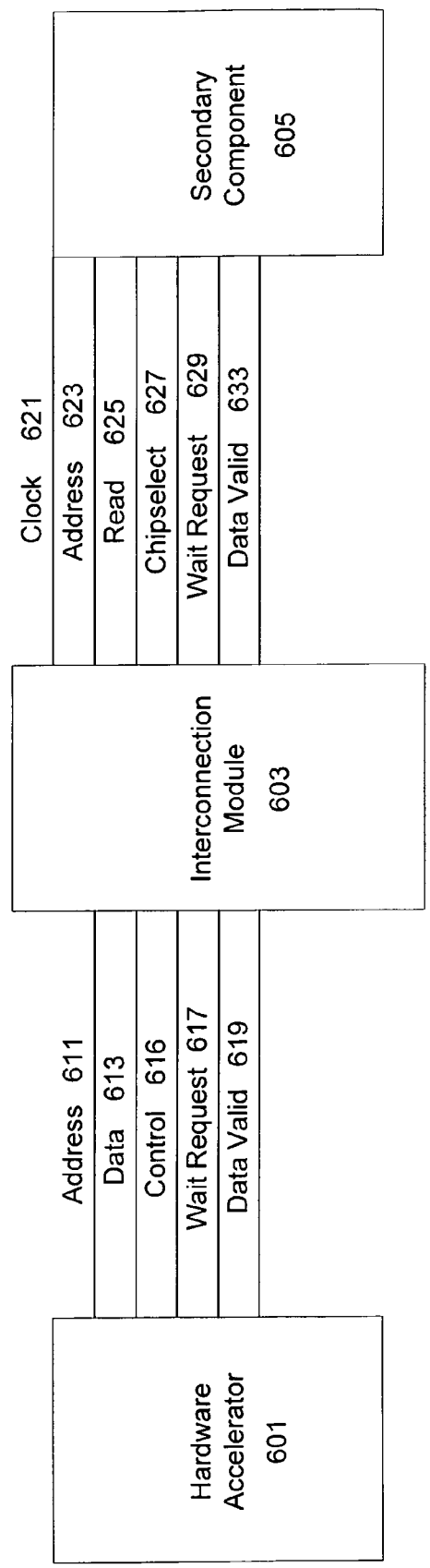
FIG. 6 is a diagrammatic representation showing an interconnection module and associated ports.

FIG. 6 is a diagrammatic representation showing one example of a port used to handle a pointer write. The write port couples a hardware accelerator 601 to a slave component 605 through an interconnection module 603. According to various embodiments, the write port includes address 611, data 613, control 615, and wait request lines 617. Address 611, data 613, control 615, and wait request lines 617 couple the hardware accelerator 601 and an interconnection module 603. The wait request line 617 is used to indicate when a master component should wait. An interconnection module 603 also routes clock lines 621, address lines 623, read lines 625, chip select lines 627, and wait request lines 629 to a slave component 605. A read data line 631 is routed from the slave component 605 to the interconnection module 603.

In one example, a first bus cycle starts on the rising edge of clock line 621. A hardware accelerator 601 provides an address 0xFF56DA over address line 611. Address 623 and read 625 from the interconnection module 603 to the slave component 605 are set to valid. The interconnection module 603 decodes the address and asserts chipselect 627. In some examples, the slave component 605 asserts waitrequest 629 before the next rising edge of clock 621. The interconnection module 603 samples waitrequest 629 at the rising edge of clock 621. The waitrequest is forwarded to hardware accelerator 601 along waitrequest line 617. When a slave component provides valid read data 625, the slave component deasserts waitrequest 629. The interconnection module 603 then captures the read data 625 and forwards the data on data line 613.

It should be noted that the architecture can also be used to support variable latency with the addition of a data valid line. Any mechanism used to indicate to a master component that data is available from a slave component is referred to herein as a data valid line. In some examples, a data valid line is used indicate when data is available for reading from a memory buffer. When data is available, the slave component drives a valid read data to indicate that it can accept another pending read transfer.

Accessing a slave component such as memory through an interconnection module typically takes multiple clock cycles before a response is returned. In many instances, slave component access such as memory access is a system performance limiting factor. Consequently, the techniques of the present invention provide mechanisms for keeping a slave component busy with requests. In one example, downstream logic can be scheduled based on the expected latency of memory access. Knowing the expected memory latency allows the request pipe to be kept full. According to various embodiments, the expected latency is set as the maximum latency associated with accessing any slave component.

In one example, the slave component with the highest latency is a slave component having a maximum latency of 10 clock cycles. In some examples, a hardware accelerator is then generated with support for instructions with 10 stage pipelines. That is, up to 10 instructions will be in execution during any single clock cycle. The data path can be separated into up to 10 stages. For example, data path stages for typical systems including instruction fetch, instruction decode, register file read, address calculation, etc. In other examples, instructions with 5 stage pipelines are provided when a memory has a latency of 10 clock cycles.

In some examples, responses may be returned sooner than a maximum slave component latency. Consequently, a buffer is provided to hold the results until the hardware accelerator acquires the value. In some examples, the buffer is sized so that is can hold data for a number of clock cycles equal to the maximum slave component latency in clock cycles.

Figure 7:
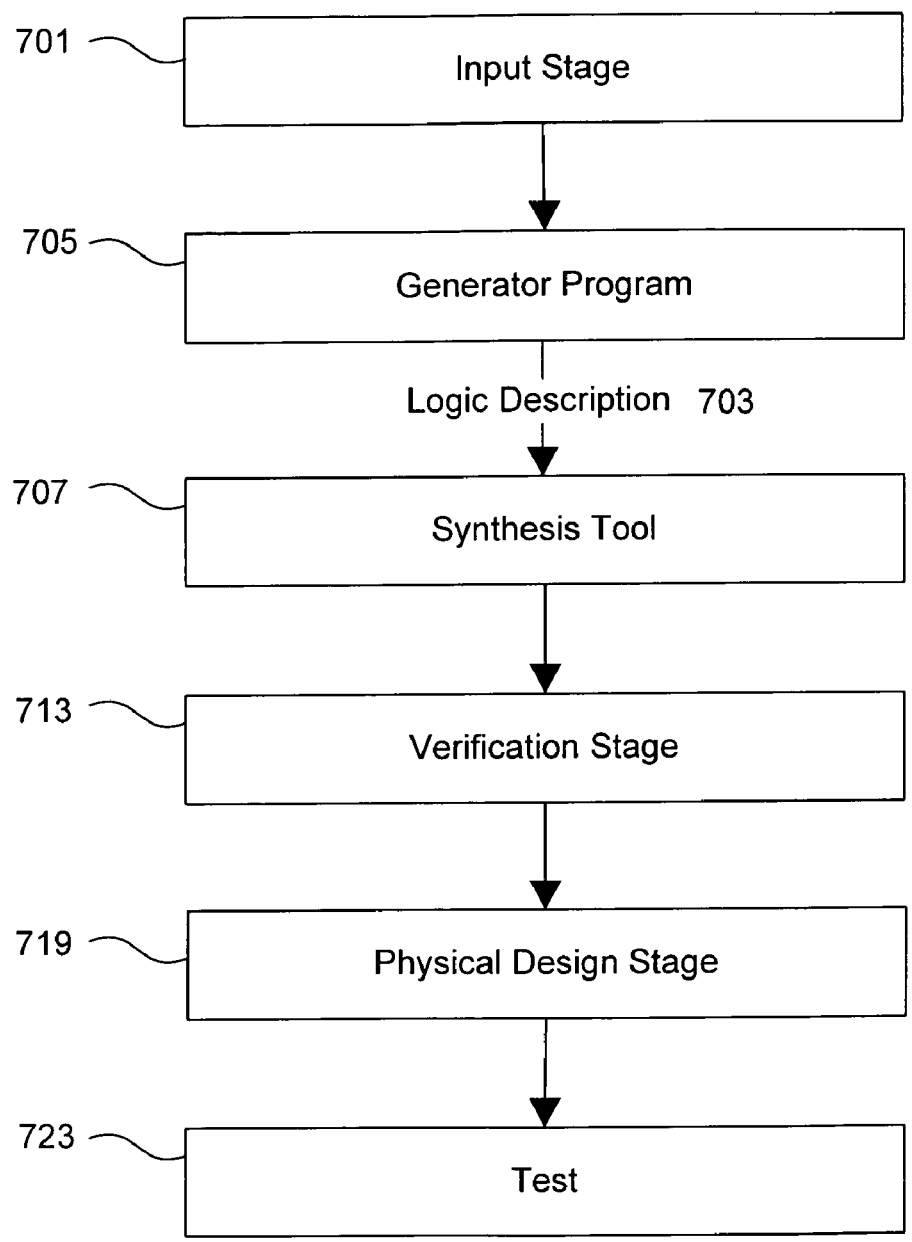
FIG. 7 is a diagrammatic representation showing a technique for implementing the programmable chip.

FIG. 7 is a diagrammatic representation showing implementation of an electronic device using a programmable chip tool. An input stage 701 receives selection information typically from a user for logic such as a processor core as well as other components such as a streaming output device to be implemented on an electronic device. In one example, the input received is in the form of a high-level language program. A generator program 705 creates a logic description and provides the logic description along with other customized logic to any of a variety of synthesis tools, place and route programs, and logic configuration tools to allow a logic description to be implemented on an electronic device.

In one example, an input stage 701 often allows selection and parameterization of components to be used on an electronic device. The input stage 701 also allows configuration of variable or fixed latency support. In some examples, components provided to an input stage include intellectual property functions, megafunctions, and intellectual property cores. The input stage 701 may be a graphical user interface using wizards for allowing efficient or convenient entry of information. The input stage may also be a text interface or a program reading a data file such as a spreadsheet, database table, or schematic to acquire selection information. The input stage 701 produces an output containing information about the various modules selected.

In typical implementations, the generator program 705 can identify the selections and generate a logic description with information for implementing the various modules. The generator program 705 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 705 identifies pointers and provides ports for each pointer. One tool with generator program capabilities is System on a Programmable Chip (SOPC) Builder available from Altera Corporation of San Jose, Calif. The generator program 705 also provides information to a synthesis tool 707 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 709.

As will be appreciated by one of skill in the art, the input stage 701, generator program 705, and synthesis tool 707 can be separate programs. The interface between the separate programs can be a database file, a log, or simply messages transmitted between the programs. For example, instead of writing a file to storage, the input stage 701 can send messages directly to the generator program 705 to allow the generator program to create a logic description. Similarly, the generator program can provide information directly to the synthesis tool instead of writing HDL files. Similarly, input stage 701, generator program 705, and synthesis tool 707 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 707.

A synthesis tool 707 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 713 typically follows the synthesis stage 707. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 713, the synthesized netlist file can be provided to physical design tools 719 including place and route and configuration tools. A place and route tool typically locates logic cells on specific logic elements of a target hardware device and connects wires between the inputs and outputs of the various logic elements in accordance with logic required to implement an electronic design. The device can also be physically tested at 723.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 701, the generator program 705, the synthesis tool 707, the verification tools 713, and physical design tools 719 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 8:
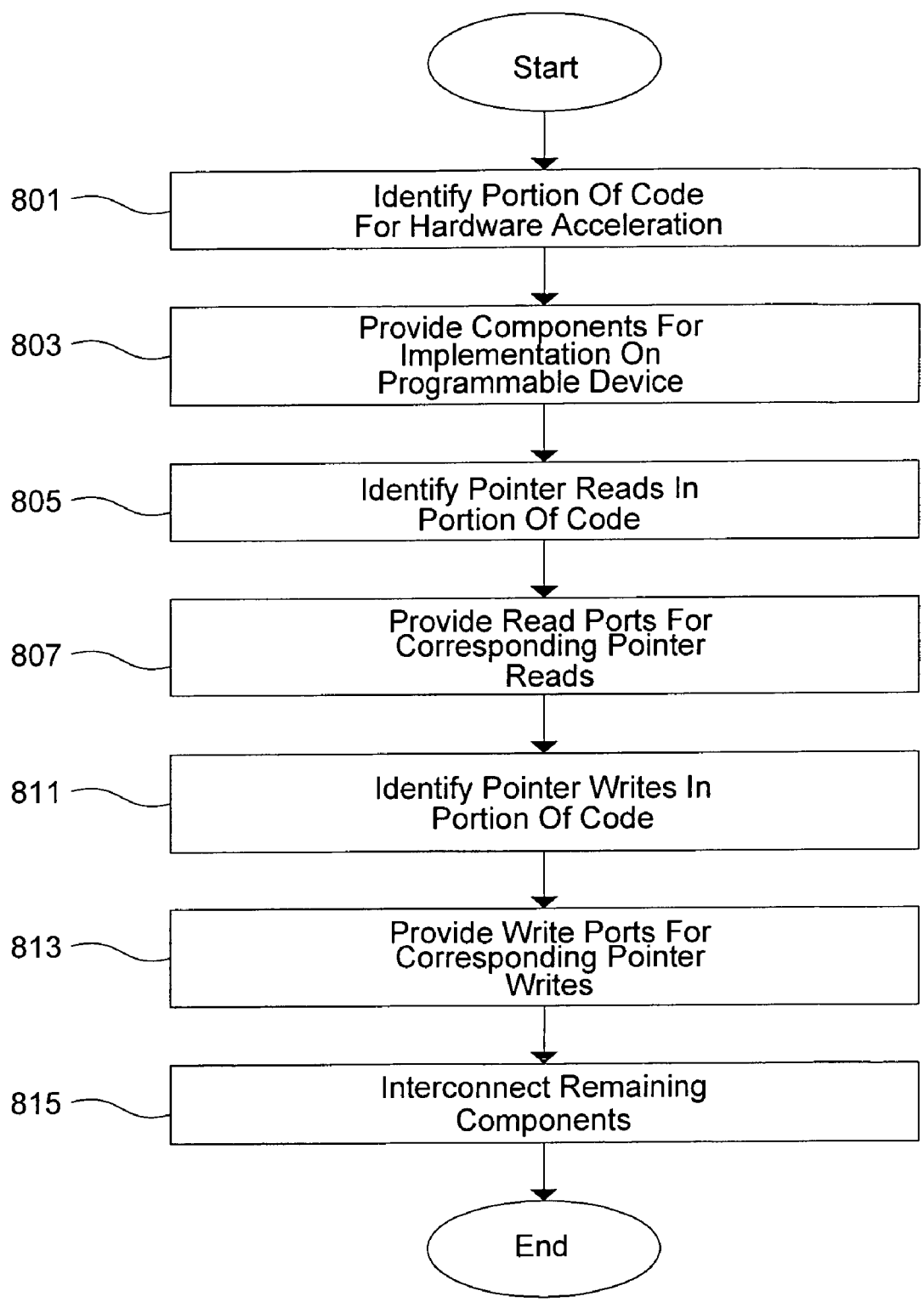
FIG. 8 is a process flow diagram showing a technique for generating a hardware accelerator.

FIG. 8 is a flow process diagram showing one technique for implementing a programmable device using high-level language code. At 801, the portion of code of a high-level language program is identified for hardware acceleration. It should be noted that a portion of code can include many disparate and disconnected lines in a software program, or even segments in different files. The generator program can identify the code for hardware acceleration in a variety of manners. In one example, inner loops that are run frequently are designated for hardware acceleration. In another example, a user specifies the type of code that should be configured for hardware acceleration. In yet another example, an available profiler or feedback tool is used to measure the performance of various instructions and provide information to a generator tool to identify a portion of code for hardware acceleration. At 803, components are provided for implementation on the programmable device.

In some examples, components are acquired from a library of components associated with a generator program. The components can include peripheral components and peripheral interfaces such as universal asynchronous receiver transmitters (UARTs), parallel input outputs (PIOs), timers, a streaming output devices, and memory. At 805, pointer reads are identified in the portion of code designated for hardware acceleration. According to various embodiments, pointers in the selected portion of code for hardware acceleration are configured by using specific logic and circuitry for handling pointers. A parser can be used to identify code associated with pointer operations. In many conventional implementations, very limited pointer support is available. However, the techniques and mechanisms of the present invention allow robust handling of pointer referencing and dereferencing. In one example, pointer reads are handled by providing read ports associated with the hardware accelerator at 808.

At 811, pointer writes are identified in the portion of code configured for hardware acceleration at 813, write ports are provided for each corresponding pointer write. At 815, the components for implementation on the programmable device are interconnected. According to various embodiments, hardware accelerator read and write ports are connected to memory through an interconnection fabric. The hardware accelerator read and write ports have the same access to memory a processor core has.

Figure 9:
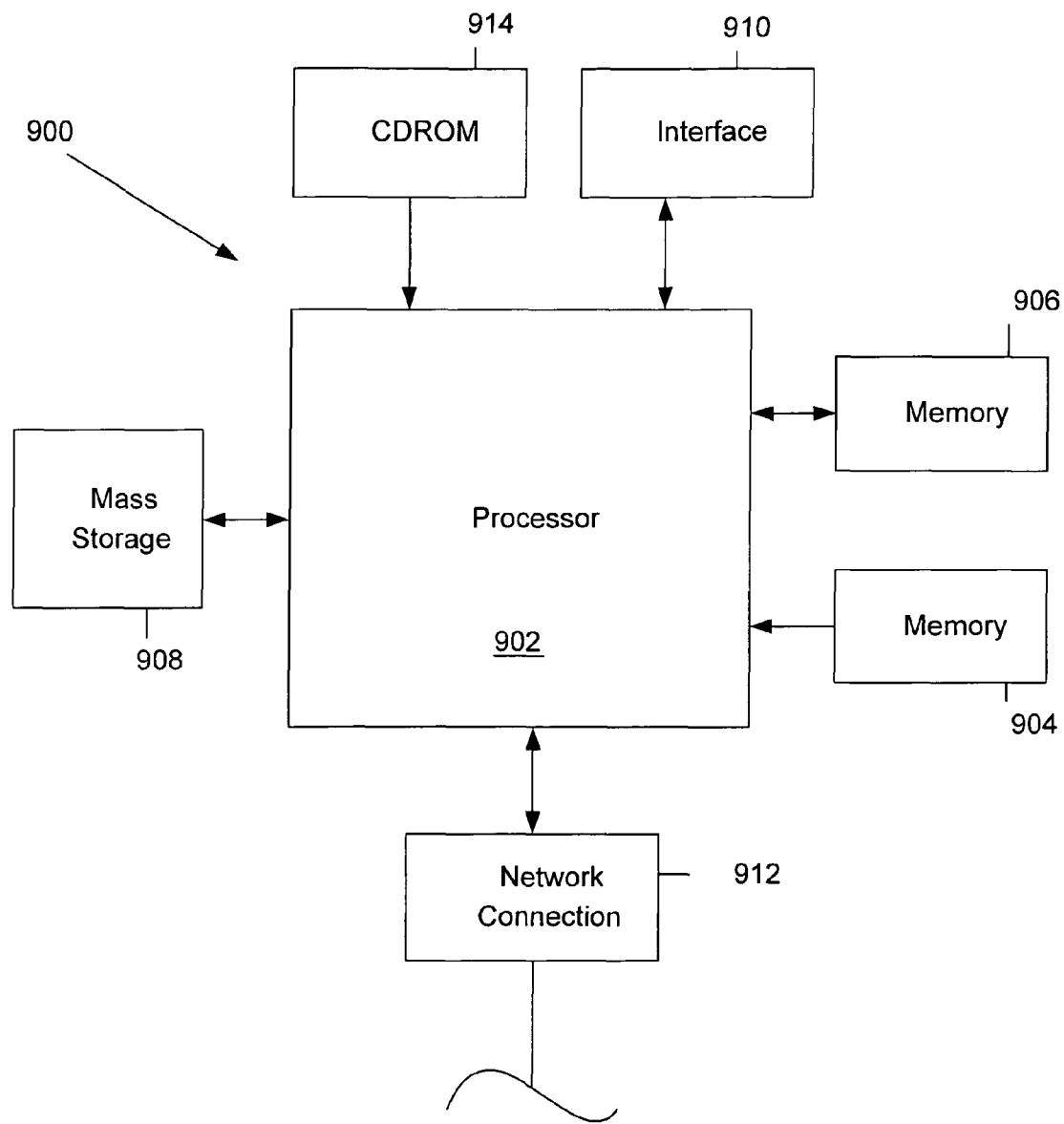
FIG. 9 is a diagrammatic representation depicting a computer system.

FIG. 9 illustrates a typical computer system that can be used to implement a programmable chip having shared I/O lines. The computer system 900 includes any number of processors 902 (also referred to as central processing units, or CPUs) that are coupled to devices including memory 906 (typically a random access memory, or "RAM"), memory 904 (typically a read only memory, or "ROM"). The processors 902 can be configured to generate a test sequences for any designated processor. As is well known in the art, memory 904 acts to transfer data and instructions uni-directionally to the CPU and memory 906 is used typically to transfer data and instructions in a bi-directional manner.

Both of these memory devices may include any suitable type of the computer-readable media described above. A mass storage device 908 is also coupled bi-directionally to CPU 902 and provides additional data storage capacity and may include any of the computer-readable media described above. The mass storage device 908 may be used to store programs, data and the like and is typically a slave storage medium such as a hard disk that is slower than memory. The mass storage device 908 can be used to hold a library or database of pre-packaged logic or intellectual property functions, as well as information on generating particular configurations. It will be appreciated that the information retained within the mass storage device 908, may, in appropriate cases, be incorporated in standard fashion as part of memory 906 as virtual memory. A specific mass storage device such as a CD-ROM 914 may also pass data uni-directionally to the CPU.

CPU 902 is also coupled to an interface 910 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 902 optionally may be coupled to a computer or telecommunications network using a network connection as shown generally at 912. With such a network connection, it is contemplated that the CPU might receive information from the network, or might output information to the network in the course of performing the above-described method steps. It should be noted that the system 900 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 908 or 914 and executed on CPU 908 in conjunction with master memory 906.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of master and slave components and should not be restricted to the ones mentioned above. It is therefore intended that the invention be interpreted to include all variations and equivalents that fall within the true spirit and scope of the present invention.

What is claimed is:

1. A method comprising:
identifying a first pointer and a second pointer included in a high level program language loop;
determining an iteration count, wherein the iteration count is a number of loop iterations after which a collision occurs between the first pointer and the second pointer;
determining a memory latency for accessing a memory associated with the programmable chip;
using the memory latency and the iteration count to determine a number of clock cycles required to perform the high-level language program loop; and
generating a hardware accelerator for implementation on the programmable chip, the hardware accelerator operable to determine the number of clock cycles required to perform the high-level language program loop.

2. The method of claim 1, wherein the number of clock cycles required to perform the high-level language programming loop is a cycle per loop iteration value.

3. The method of claim 2, wherein the first pointer is associated with a first state number and the second pointer is associated with a second state number.

4. The method of claim 3, wherein the cycle per loop iteration value is calculated applying a ceiling function (ceil) to the second pointer state number minus the first pointer state number plus one all divided by the iteration count.

5. The method of claim 4, wherein the state number is assigned the value of memory latency.

6. The method of claim 4, wherein the iteration count is an offset between a first pointer address and a second pointer address.

7. The method of claim 6, wherein the offset is a constant known at compile time, the offset corresponding to an address offset between the pointer and the second pointer.

8. The method of claim 6, wherein the memory latency is the number of clock cycles needed to complete a memory access operation.

9. The method of claim 2, wherein if the first pointer A is associated with a write operation and the second pointer is associated with a read operation and the first pointer and the second pointer addresses are equivalent, the second pointer is turned into a simple intermediate assignment that takes a first pointer write operation data value from the first pointer.

10. The method of claim 6, wherein if the first pointer is associated with a write operation and the second pointer is equivalent with a read operation, a number of items corresponding to the offset is prefetched.

11. A computer system comprising:
an interface operable to receive high-level language code; and
a processor operable to identify a first pointer and a second pointer included in a high level program language loop, determine an iteration count, wherein the iteration count is a number of loop iterations after which a collision occurs between the first pointer and the second pointer, and determine a memory latency for accessing a memory associated with the programmable chip;
wherein the processor is further operable to use the memory latency and the iteration count to determine a number of clock cycles required to perform the high-level language program loop and generate a hardware accelerator for implementation on the programmable chip, the hardware accelerator operable to determine the number of clock cycles required to perform the high-level language program loop.

12. The computer system of claim 1, wherein the number of clock cycles required to perform the high-level language programming loop is a cycle per loop iteration value.

13. The computer system of claim 12, wherein the first pointer is associated with a first state number and the second pointer is associated with a second state number.

14. The computer system of claim 13, wherein the cycle per loop iteration value is calculated applying a ceiling function (ceil) to the second pointer state number minus the first pointer state number plus one all divided by the iteration count.

15. The computer system of claim 14, wherein the state number, is assigned the value of memory latency.

16. The computer system of claim 14, wherein the iteration count is an offset between a first pointer address and a second pointer address.

17. The computer system of claim 16, wherein the offset is a constant known at compile time, the offset corresponding to an address offset between the first pointer and the second pointer.

18. The computer system of claim 16, wherein the memory latency is the number of clock cycles needed to complete a memory access operation.

19. The computer system of claim 12, wherein if the first pointer is associated with a write operation and the second pointer is associated with a read operation and the first pointer and the second pointer addresses are equivalent, the second pointer is turned into a simple intermediate assignment that takes a first pointer write operation data value from the first pointer.

20. The computer system of claim 16, wherein if the first pointer is associated with a write operation and the second pointer is equivalent with a read operation, a number of items corresponding to the offset is prefetched.

21. An apparatus comprising:
means for identifying a first pointer and a second pointer included in a high level program language loop;
means for determining an iteration count, wherein the iteration count is a number of loop iterations after which a collision occurs between the first pointer and the second pointer ;
means for determining a memory latency for accessing a memory associated with the programmable chip;

means for using the memory latency and the iteration count to determine a number of clock cycles required to perform the high-level language program loop; and means for generating a hardware accelerator on the programmable chip, the hardware accelerator operable to determine the number of clock cycles required to perform the high level language program loop.

22. The apparatus of claim 21, wherein the number of clock cycles required to perform the high-level language programming loop is a cycle per loop iteration.

23. The apparatus of claim 22, wherein the first pointer is associated with a first state number and the second pointer is associated with the second state number.

24. The apparatus of claim 23, wherein the cycle per loop iteration is calculated applying a ceiling function (ceil) to the second pointer state number minus the first pointer state number plus one all divided by the iteration count.

25. The apparatus of claim 24, wherein the state number is assigned the value of memory latency.

26. A non-transitory computer readable medium comprising:

computer code for identifying a first pointer and a second pointer included in a high level program language loop;

computer code for determining an iteration count, wherein the iteration count is a number of loop iterations after which a collision occurs between the first pointer and the second pointer;

computer code for determining a memory latency for accessing a memory associated with the programmable chip;

computer code for using the memory latency and the iteration count to determine a number of clock cycles required to perform the high-level language program loop; and computer code for generating a hardware accelerator for implementation on the programmable chip, the hardware accelerator operable to determine the number of clock cycles to perform the high-level language program loop.

27. The computer readable of claim 26, wherein the number of clock cycles required to perform the high-level language programming loop is a cycle per loop iteration.

28. The computer readable of claim 27, wherein the first pointer is associated with a first state number and the second pointer is associated with the second state number.

29. The computer readable of claim 28, wherein the cycle per loop iteration is calculated applying a ceiling function (ceil) to the second pointer state number minus the first pointer state number plus one all divided by the iteration count.

30. The computer readable of claim 29, wherein the state number is assigned the value of memory latency.

* * * * *